United States Patent
Grant

[19]
[11] Patent Number: 6,166,464
[45] Date of Patent: Dec. 26, 2000

[54] POWER MODULE

[75] Inventor: William Grant, Fountain Valley, Calif.

[73] Assignee: International Rectifier Corp., El Segundo, Calif.

[21] Appl. No.: 09/375,716

[22] Filed: Aug. 17, 1999

Related U.S. Application Data

[60] Provisional application No. 06/097,637, Aug. 24, 1998.

[51] Int. Cl.[7] .................................................. H02K 11/00
[52] U.S. Cl. ...................................... 310/68 R; 310/68 D
[58] Field of Search ................................ 310/68 R, 68 D; 361/748, 728, 730, 736, 752

[56] References Cited

U.S. PATENT DOCUMENTS

| | | | |
|---|---|---|---|
| 4,668,898 | 5/1987 | Harms et al. | 310/67 R X |
| 5,408,128 | 4/1995 | Furnival | 257/690 |
| 5,747,908 | 5/1998 | Saneshige et al. | 310/91 |
| 5,783,881 | 7/1998 | Best et al. | 310/68 C |

FOREIGN PATENT DOCUMENTS

| | | |
|---|---|---|
| 1-246857 | 10/1989 | Japan . |
| 5-304248 | 11/1993 | Japan . |
| 7-240497 | 9/1995 | Japan . |
| 8-7956 | 1/1996 | Japan . |

*Primary Examiner*—Nestor Ramirez
*Assistant Examiner*—Judson H. Jones
*Attorney, Agent, or Firm*—Ostrolenk, Faber, Gerb & Soffen, LLP

[57] ABSTRACT

A power module for a motor in which the module is arranged to house both the high power devices needed to drive the phase windings of the motor and the control electronics needed to control the operation of the high power devices. The components are arranged such that the thermal energy generated by the high power devices is directed away from the control electronics for subsequent dissipation. An insulated metal substrate is used as the base of the module for directing the thermal energy. Further, the module components can be easily assembled through the use of solderless resilient connections from the control electronics to the other components in the module. The module employs a base, a power shell coupled to the base, and a circuit board positioned within the internal chamber of the power shell. The power shell has a plurality of walls forming an internal chamber and at least one conductive region. At least one electronic device is mounted to the conductive region.

15 Claims, 9 Drawing Sheets

POWER MODULE

This application is based on, and claims priority to, U.S. Provisional Application Ser. No. 60/097,637. filed Aug. 24, 1998, entitled POWER MODULE, the contents of which are incorporated herein by reference.

BACKGROUND OF THE INVENTION

The present invention relates to power modules and, more specifically, to an integrated power package for motor control utilizing internal terminals for heat dissipation.

Power modules employing semiconductor devices are used in many different applications. One popular use for power modules is for driving and controlling motors. These power modules often use field effect transistors (FETs), particularly power metal oxide FETE (MOSFETs) to supply power to drive the motor based on signals received from a low power control circuit. While FETs are capable of switching the high currents needed to drive a powerful motor such as might be found in an automotive power steering mechanism, they also generate a significant amount of thermal energy when switching these large currents.

Large heat sinks are often used to dissipate the thermal energy generated by the FETs. This leads to large module package sizes and complicated semiconductor mounting arrangements. Also, locating the sensitive low power control circuitry close to the power semiconductors can reduce the reliability of the module and effect its operation due to the damaging thermal energy radiated by the FETs.

These module packaging requirements can be particularly onerous in automotive applications where the power module must be small and be co-located with the motor being driven. For example, a power steering electric motor driver module is optimally mounted directly to the mechanical power steering components it is driving. The presence of large heat sinks or extensive wiring and cabling between the power semiconductors and the module control circuitry is undesired as it prevents an efficient use of power semiconductor devices to control an electric motor.

SUMMARY OF THE INVENTION

The present invention provides a power semiconductor module that is compact, capable of driving high torque electric motors including switched reluctance motors and has the control circuit integrated within the module. The power, ground and motor terminals extend through the shell of the module such that the high power devices are mounted directly thereto. High power devices are interconnected without the use of wires or cables.

The power module of the present invention is arranged to direct thermal energy away from the control electronics such that thermal energy generated by the high power devices is transferred to a metallic substrate base, thereby providing a reliable module which is also compact such that is can be mounted proximate to the motor it is controlling.

The present invention provides an electronic module in which there is a base and a power shell coupled to the base. The power shell has a plurality of walls forming an internal chamber and at least one conductive region. At least one electronic device is mounted to at least one conductive region. A circuit board is positioned within the internal chamber of the power shell.

The present invention further provides an insulated metal substrate plate for an electronic module, in which the plate has a thermally conductive metallic substrate. A first insulating layer is affixed to the metal substrate in which the first insulating layer substantially covers the metal substrate. At least two conductive regions are affixed to the insulating layer, the at least two conductive regions being etched to form a plurality of discrete regions. A second insulating layer is disposed between the at least two conductive regions, and a solder mask is disposed on the at least one conductive region.

Other features and advantages of the present invention will become apparent from the following description of the invention which refers to the accompanying drawings.

For the purpose of illustrating the invention, there is shown in the drawings a form which is presently preferred, it being understood, however, that the invention is not limited to the precise arrangement and instrumentality shown.

DETAILED DESCRIPTION OF THE INVENTION

Figure 1:
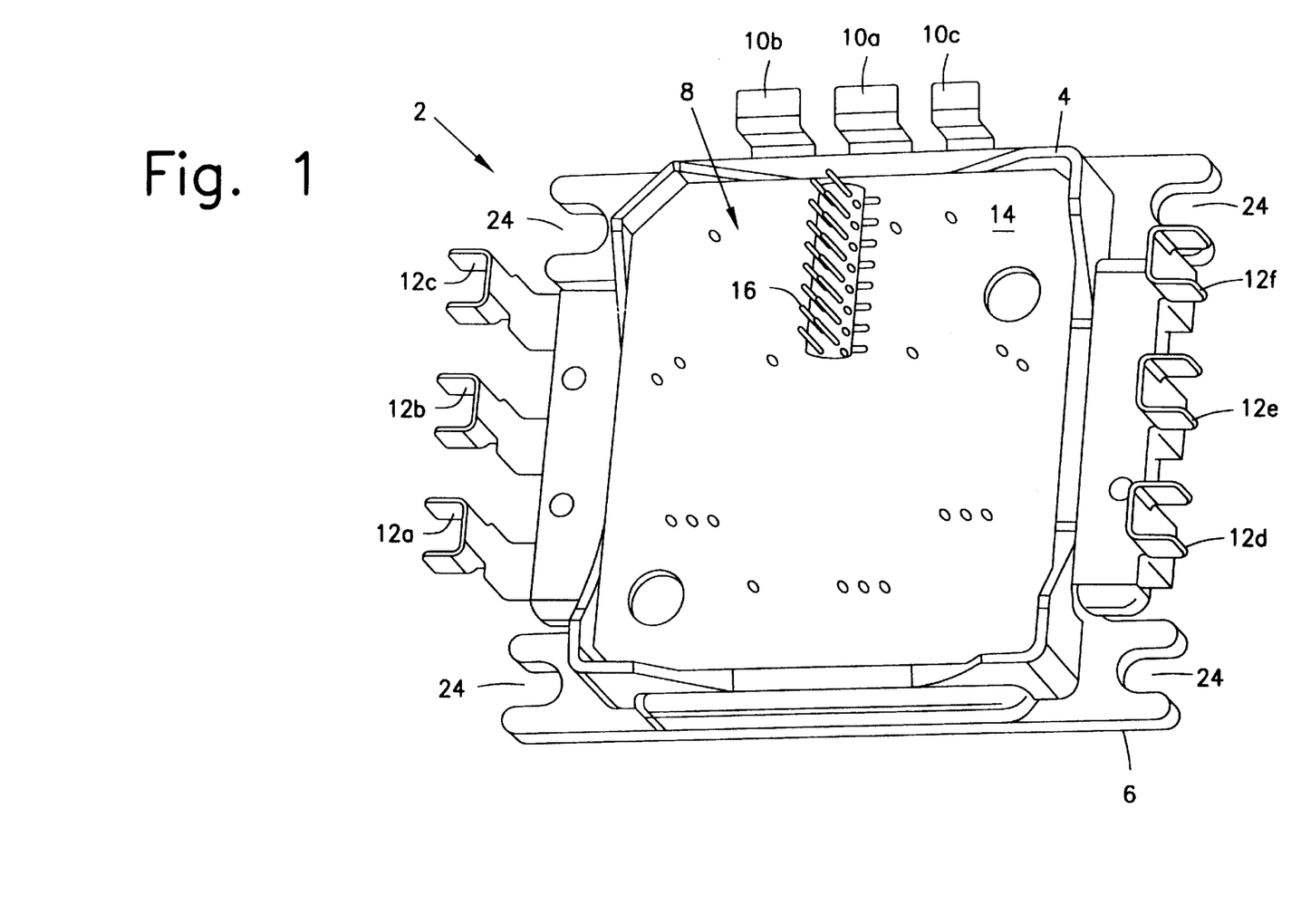
FIG. 1 is a perspective view of an assembled power module of the present invention.
Figure 2:
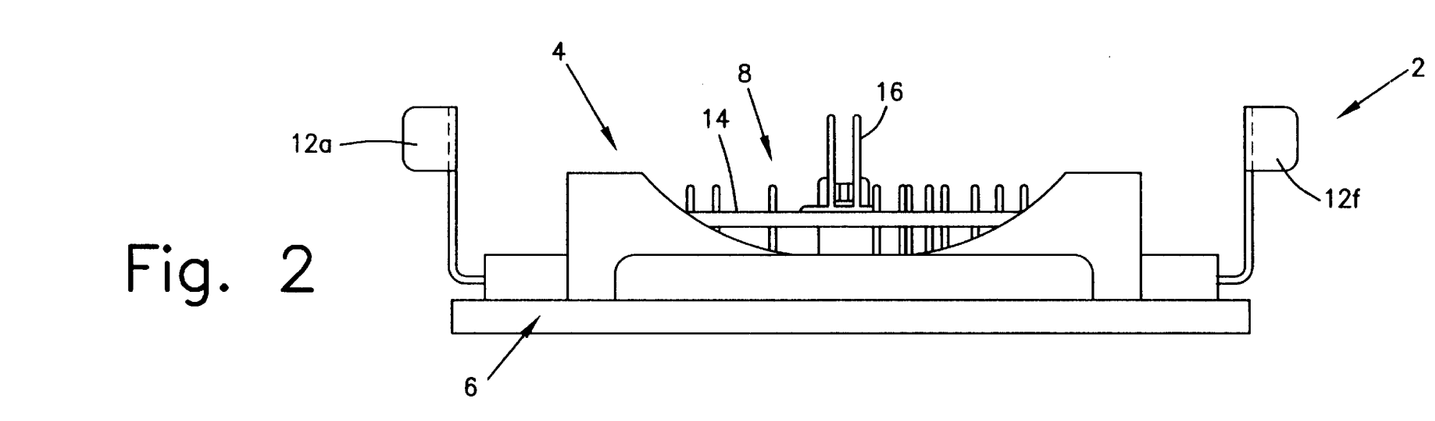
FIG. 2 is a front side view of an assembled power module of the present invention.
Figure 3:
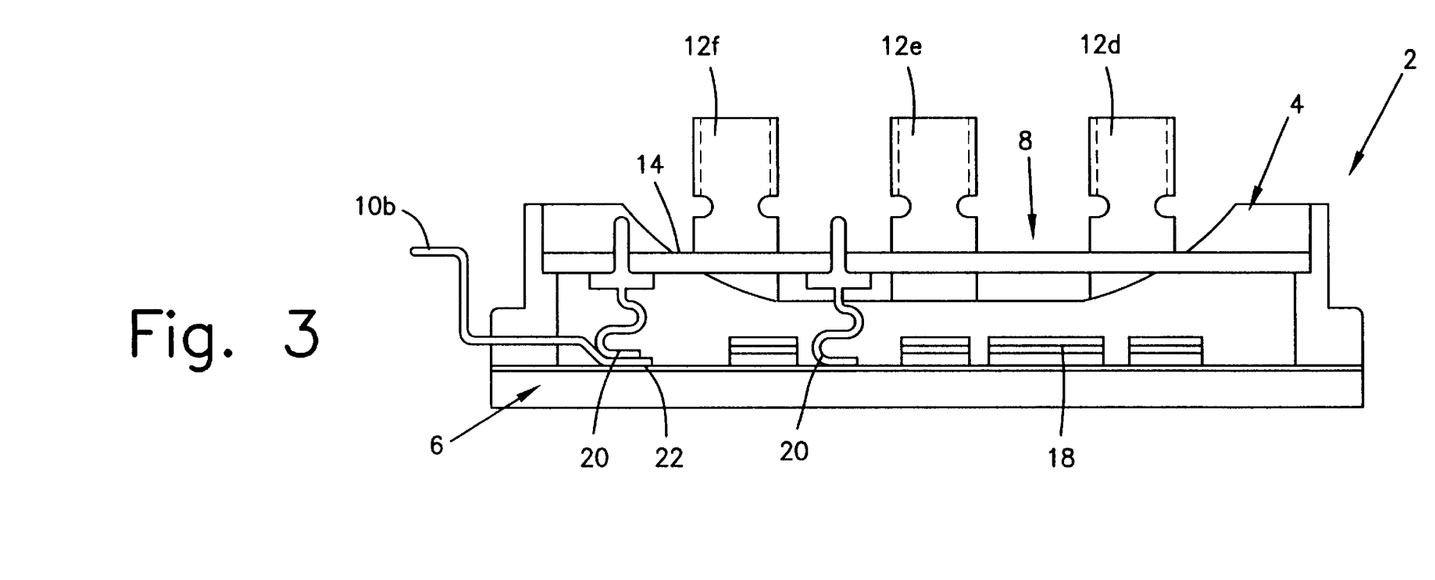
FIG. 3 is a lateral side view of an assembled power module of the present invention.

With reference to the Figures in which like reference numerals refer to like elements, FIGS. 1, 2 and 3 show a perspective view, a front side view and a lateral side view, respectively, of an assembled module 2 of the present invention. Power module 2 is comprised of three main sub-components, namely, power shell 4, base plate 6 and circuit board 8. As shown, power shell 4 is mounted on base plate 6, and circuit board 8 is fit into the cavity in power shell 4. Each of these sub-components are discussed in detail below.

In a preferred embodiment, power module 2 is used in an electrically powered automotive steering application in which the electrical components form a 4-phased switched reluctance motor convertor Accordingly, semiconductor components, such as power MOSFETs, are employed to convert an input source of DC power into suitable AC output power to drive the motor. It is also contemplated that the power module of the present invention can be easily adapted for use as a three phase DC brushless motor convertor.

Power shell 4 includes input power terminals 10a, 10b and 10c which are preferably adapted to receive DC input power from an external source (not shown). For example, terminal 10*a* is a positive voltage terminal, terminal 10*b* is a negative voltage terminal and terminal 10*c* is a chassis ground terminal. Power shell 4 also includes motor phase terminals 12*a*, 12*b*, 12*c*, 12*d*, 12*e* and 12*f* which are preferably adapted to provide electrical conductivity from power module 2 to the various phase windings of a 4-phased switched reluctance motor for which the power module is designed to control. It should be noted that motor phase terminals 12*a–f* are integrally molded with power shell 4. A preferred power electronics section circuit for power module 2 is described in detail below.

Circuit board 8 provides the necessary low power control circuitry to drive the high power controller electronics, such as high current carrying power MOSFETs and diodes. The low power control circuit typically provides the gate drive voltage for the high power MOSFET semiconductors. The individual low power circuit devices are preferably mounted on the upper side 14 of circuit board 8. Connector 16 is mounted to circuit board 8 to provide external connectivity for the low power circuit.

Electrical connectivity between the low power circuit on circuit board 8 and the high power devices 18 mounted on power shell 4, as discussed below, is accomplished by S-pin connectors 20. Although FIG. 3 shows only two such connectors, it should be noted that additional connectors can be used, as needed. Although the connectors 20 shown are preferably "S" shaped, the connectors can take any shape as long as they provide resilient soldered or wire bonded contact between circuit board 8 and power shell 4. As shown, S-pin connectors 20 provide a springly resilient connection between circuit board 8 and power shell 4 such that by mounting circuit board 8 within the cavity in power shell 4, S-pin connectors 20 directly contact metallic tab 22 on power shell 4 or directly contact a pad area on base plate 6.

The use of S-pin connectors 20 avoids the need to use a header row or rows of connecting pins. Connecting pins arranged as a header require that the signals to be carried to other module components such as power shell 4 or base plate 6 be run to the same general location on the circuit board. This adds unnecessary length to the signal paths and increases susceptibility to noise. In contrast, the use of S-pin connectors 20 allows signals on circuit board 8 to be connected to power shell 4 or base plate 6 by making each connection independent of each other. In other words, S-pin connectors 20 allow a signal to be connected to a module component at any appropriate point in the signal path. This avoids the need to introduce added signal trace length and provides better noise immunity for power module 2.

Power module 2 may be mounted via mounting tabs 24 adapted to receive suitable fastening elements, such as bolts, as is well known in the art. Power module 2 is preferably mounted to a heatsink via base plate 6 so as to dissipate the heat generated by the high power devices. As is described in detail below, base plate 6 provides a thermal path from the high power components such that base plate 6 is preferably an insulated metal substrate (IMS) structure having a thick copper or aluminum substrate covered by a relatively thin insulation film on which a thin patternable copper or other conductive, solderable surface has been disposed.

Figure 4:
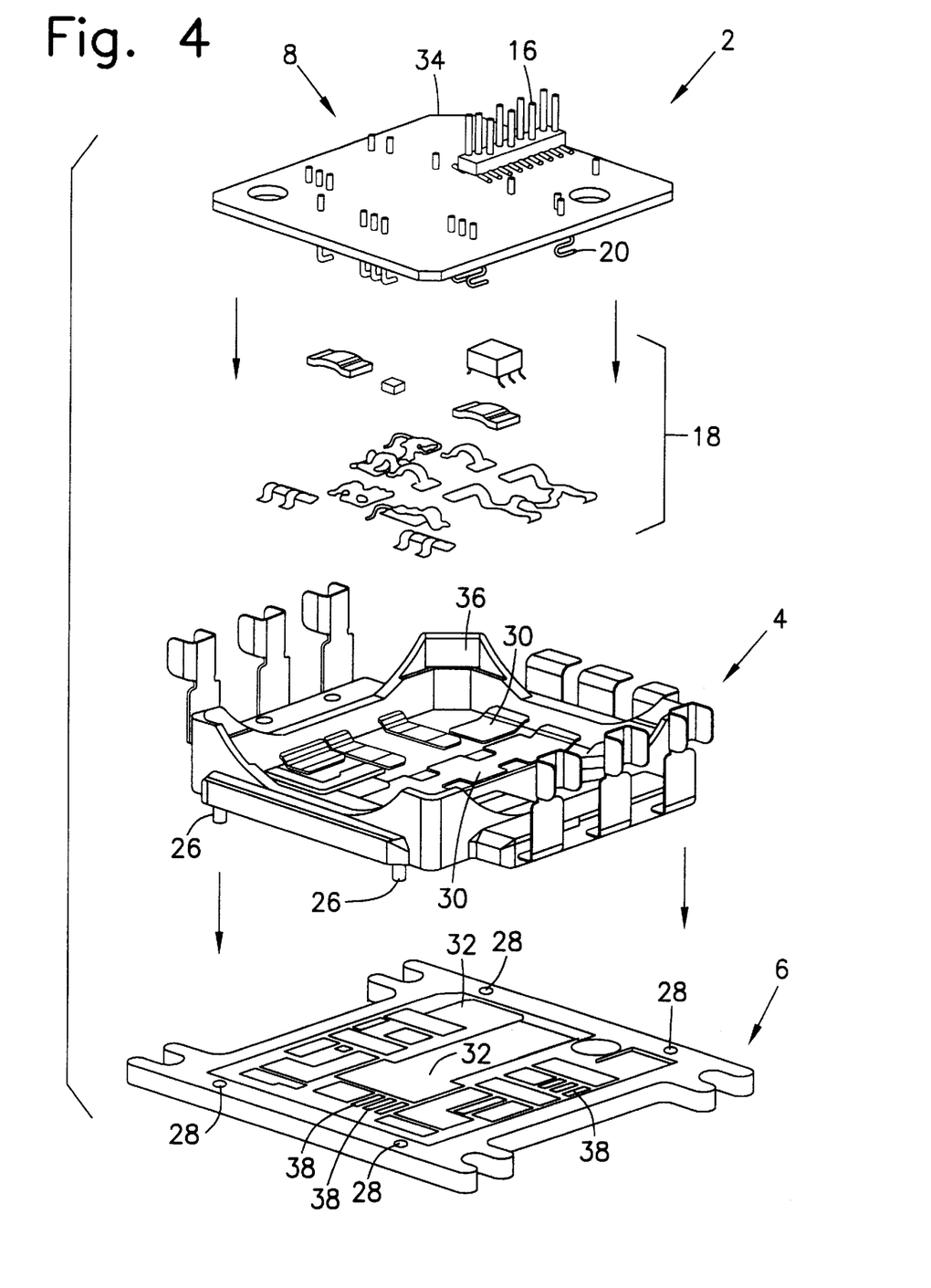
FIG. 4 is an exploded perspective view of the assembled power module shown in FIGS. 1–3.

FIG. 4 shows an exploded view of power module 2 of the present invention. Power shell 4, base plate 6 and circuit board 8 are arranged for compact assembly and efficient utilization of available surface area.

Power shell 4 is aligned with, and coupled to, base plate 6 by inserting mounting posts 26 into mounting holes 28.

Power shell 4 is molded to include conductive regions 30 upon which high power devices 18 are mounted as by soldering, a conductive epoxy, or the like. When power shell 4 is mounted to base plate 6, conductive regions 30 are positioned above respective contact trace regions 32 and are connected by soldering or a conductive adhesion. This provides an electrical connection between high power devices 18 and base plate 6.

The connection between conductive regions 30 and contact regions 32 serves two useful functions. First, it provides an electrical path to the base plate, thereby allowing for distribution of power, ground and high power signals between the various high power devices 18. Second, a thermally conductive path is provided from high power devices 18 to base plate 6. This thermally conductive path allows thermal energy to be removed from high power devices 18 and transferred to a suitable heatsink (not shown) coupled to base plate 6.

High power devices 18 are mounted on the upper side of conductive regions 30 inside power shell 4, while the bottom side of conductive regions 30 is in contact with contact regions 32 on base plate 6.

Circuit board 8 is adapted to fit into power shell 4 such that alignment notch 34 on circuit board 8 meets with alignment tab 36 on power shell 4. This ensures proper alignment of circuit board 8, and thereby simplifying power module assembly. Upon insertion into power shell 4, S-pin connectors 20 engage one or more conductive regions 30 and/or one or more respective pads 38 on base plate 6. This allows electrical conductivity between circuit board 8 and base plate 6, while simplifying fabrication.

During fabrication, circuit board 8 and its associated componentry can be assembled separately from high power devices 18 and power shell 4. Once power shell 4 and base plate 6 are assembled, and all wire bonds completed, as discussed below, circuit board 8 is easily assembled with power shell 4. Adverse effects of thermal energy on circuit board 8 are avoided using the configuration of the present invention. Thermal energy is transferred from high power devices 18 to a heatsink attached to base plate 6 in a direction away from circuit board 8.

The interior cavity formed by power shell 4, base plate 6 and the cover (not shown) is filled with a potting gel such as a siliconal elastomer.

High power devices 18 include power MOSFETs, shunt resistors, schottky diodes, and a capacitor, as discussed in detail below, and are used, for example, to provide a switched reluctance motor convertor. Although the power module of the present invention is described with respect to a switched reluctance motor convertor, those of ordinary skill in the art would appreciate that power module 2 can be adapted to any configuration employing power semiconductor devices and low power control circuitry.

Figure 5:
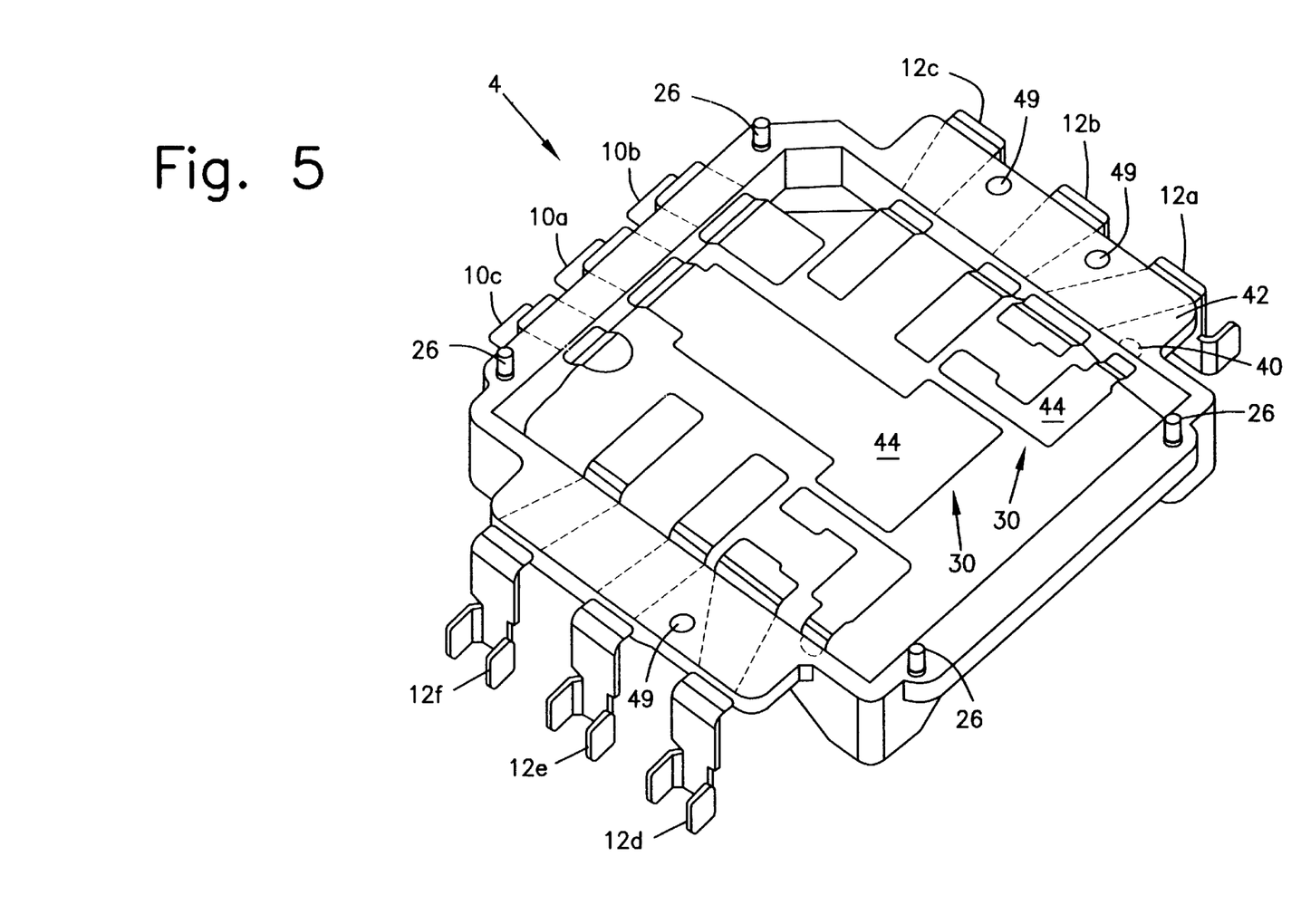
FIG. 5 is a bottom view of a power shell used in a power module of the present invention.
Figure 6:
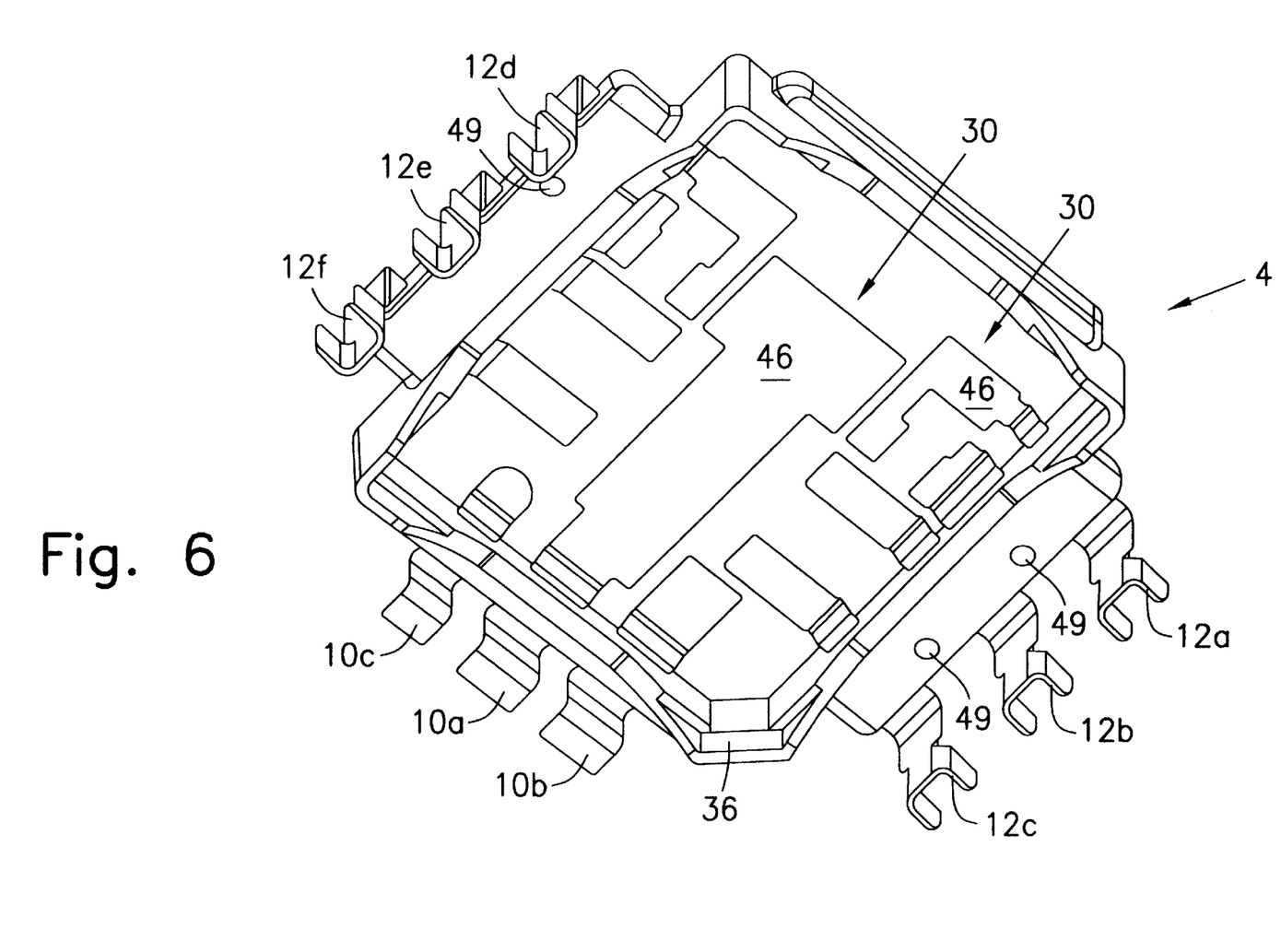
FIG. 6 is a top view of a power shell used in a power module of the present invention.

FIGS. 5 and 6 show a bottom view and a top view, respectively, of power shell 4 of the present invention. FIGS. 5 and 6 show conductive regions 30 in more detail. Each of conductive regions 50 is an extension of terminals 10*a–c*, motor phase terminals 12*a–f* or a recessed portion 40 embedded into the molded plastic portion 42 of power shell 4. In the case of terminals 10*a–c* or motor phase terminals 12*a–f*, conductive regions 50 extend through, and are affixed by, molded plastic 42.

FIG. 5 shows bottom side 44 of conductive regions 30. FIG. 6 shows the top side 46 of conductive regions 30. Each of terminals 10*a–c* and motor phase terminals 12*a–f* have a conductive region 30, comprised of a bottom side 44 and top side 46. As discussed above, high power devices 18 are mounted on a respective top side 46, while bottom side 44 is in electrical contact with a respective contact region 32 on base plate 6.

The use of contiguous terminals 10a–c and motor phase terminal 12a–f upon which high power devices 18 are mounted simplifies construction and aids in heat distribution and dissipation.

Power shell 4 is further adapted with through-holes 48 for reception of a suitable cover (not shown).

Figure 7:
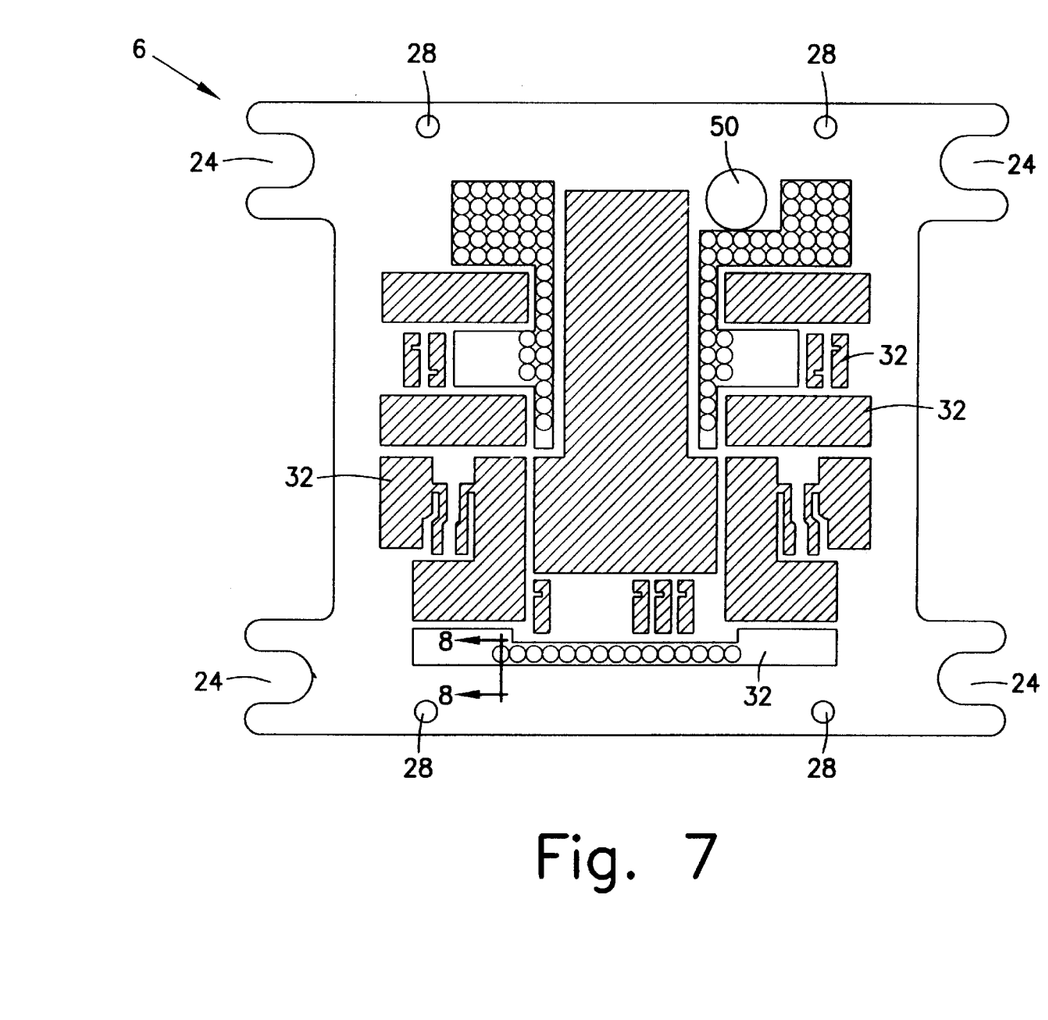
FIG. 7 is a top view of a base plate used in a power module of the present invention.

FIG. 7 shows a top view of base plate 6 of the present invention. As discussed above, base plate 6 is preferably an insulated metal substrate (IMS) structure and may be formed using known techniques. Base plate 6 is patterned to provide ground access to the substrate 48 through ground etch 50. Such an IMS structure provides good thermal conductivity from the pattern contact regions 32 through the IMS to the substrate 48. The substrate 48 is preferably aluminum and is preferably approximately 0.125 inches thick. The metallic substrate is a better conductor of thermal energy as compared with many other materials such as plastic, rubber, glass, etc. Also, the rigidity of the metallic substrate protects the module from breakage.

The IMS is patterned to form a plurality of electrically isolated conductive regions. These conductive regions allow positive and negative power connections and phase connections to be distributed, allow for separate gate pads and support the transfer of thermal energy through the substrate without shorting the various components. Although an IMS structure is preferred, other base plate structures may be employed such as Al, AlSiC and/or Cu base plates which may be isolated, for example, using an $Al_2O_3$ flame spray, direct bonded copper or active metal braze substrate.

Figure 8:
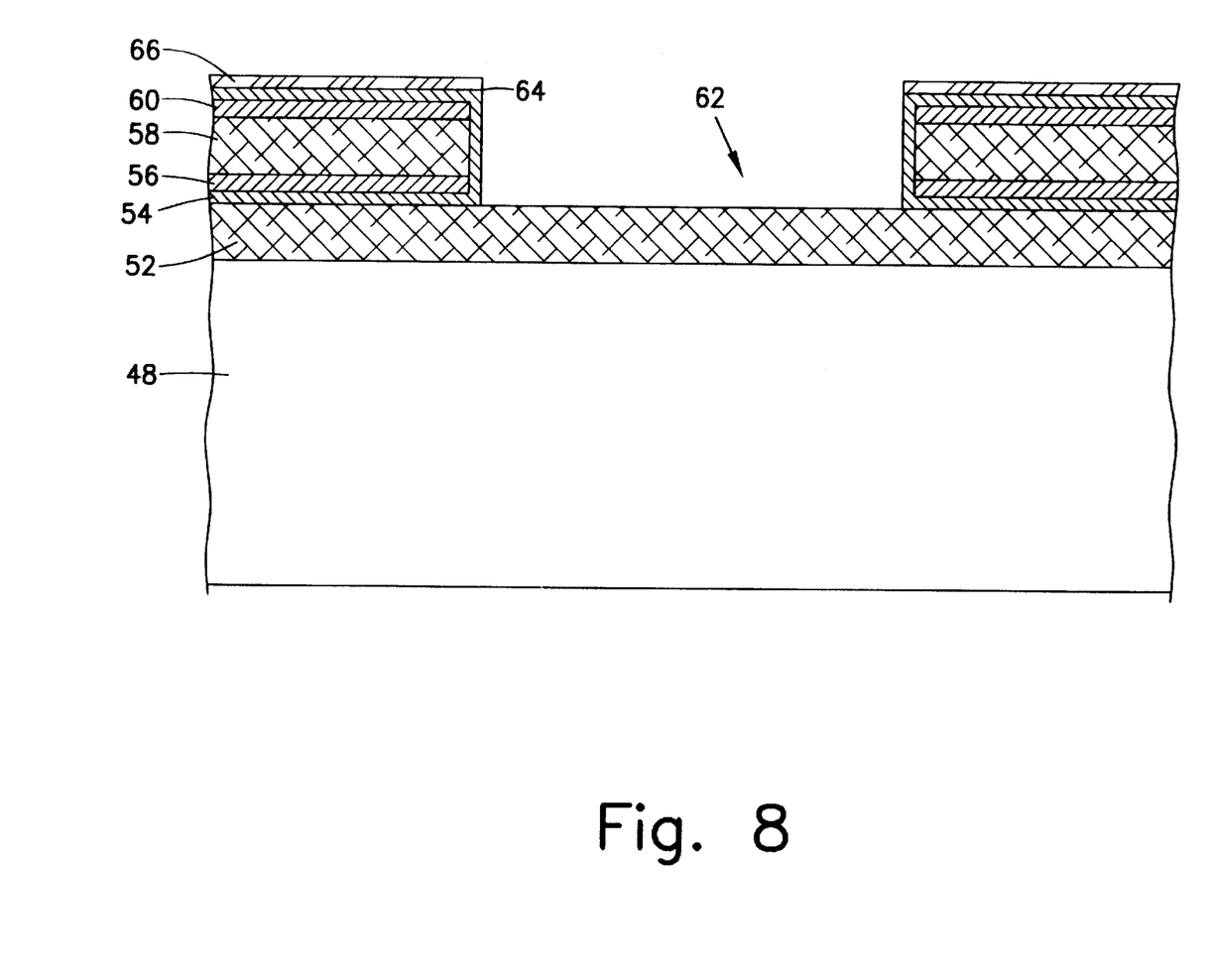
FIG. 8 is a section view of a portion of the base plate shown in FIG. 7.

FIG. 8 shows a section view taken through section 8—8 in FIG. 7. The resultant structure, as used in the present invention, is shown in FIG. 8. With reference to FIG. 8, a first dielectric layer or polymeric film 52 is positioned on substrate 48. Conductive region 54 is positioned on first dielectric 52, and conductive layer 56 is positioned on conductive region 54. Second dielectric or polymeric film 58 is positioned above conductive layer 56, and a conductive region 60 is positioned on second dielectric 58. First dielectric 52 and second dielectric 58 are preferably approximately 0.006 inches thick. Conductive region 54 is fabricated such that, when depression 62 is etched into the conductive and dielectric regions 54, 56, 58 and 60, conductive region 54 can be plated to extend laterally through depression 62 extending to form a layer above conductive region 60.

Plating layer 64 is positioned on the upper extended portion of conductive region 54. A suitable plating material, such as nickel plating can be used, preferably with a gold surface flash. The conductive region 54 is preferably approximately 0.0013 to approximately 0.0015 inches thick, and is preferably copper. Conductive regions 56 and 60 are preferably approximately 0.0024 to approximately 0.0030 inches thick, and are preferably made of copper. Finally, solder mask 66 is applied to plating layer 64, where appropriate, in order to prevent undesired electrical contact during the device soldering process.

Figure 9:
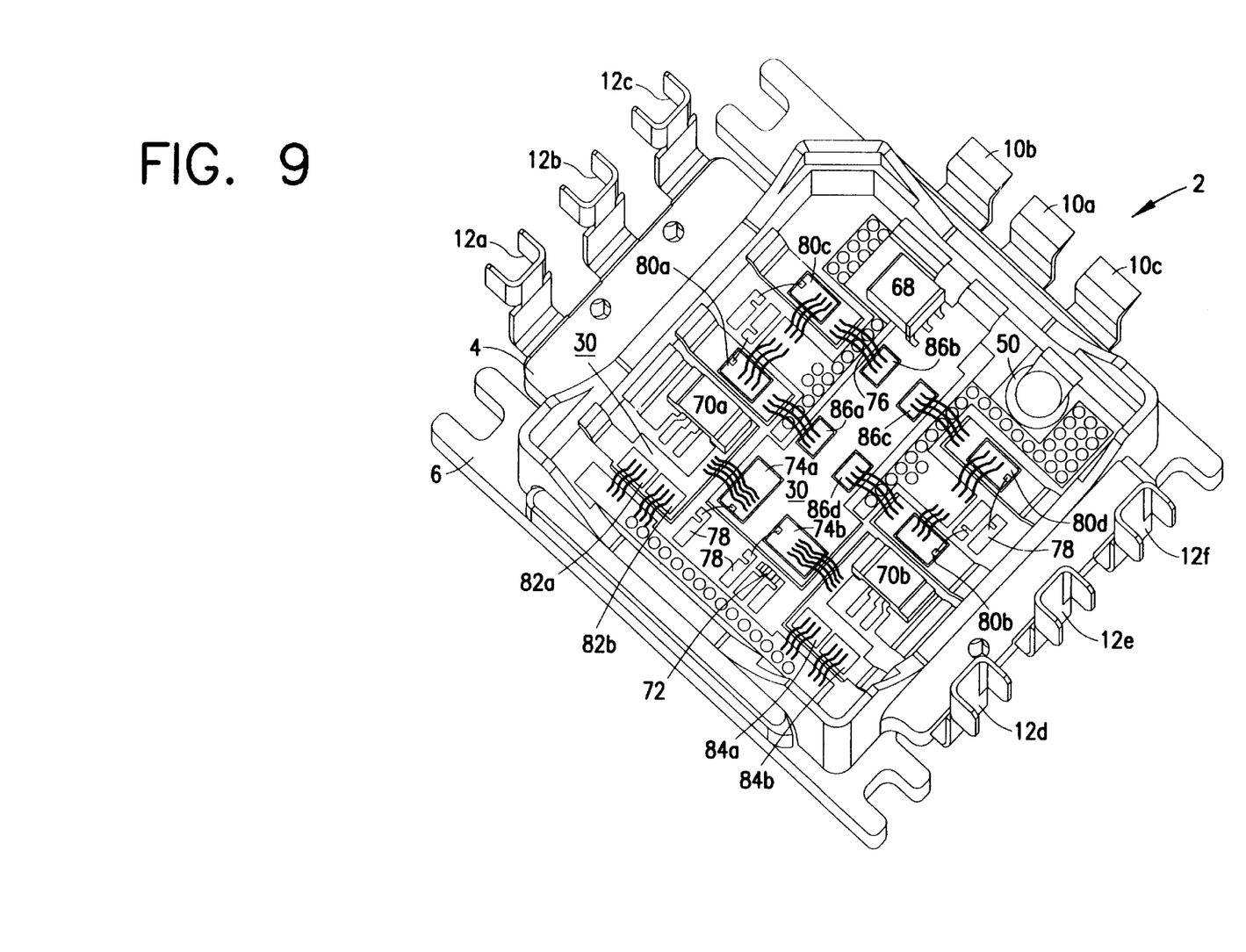
FIG. 9 is a perspective view of a power module of the present invention showing a base plate, power shell and high power devices mounted to the power shell.

An example of a power module employing the high power devices needed to fabricate a 4-phase switched reluctance motor convertor mounted on conductive regions 30 is shown in FIG. 9. Initially, it is noted that it is desirable to have a capacitor operatively coupled between the +BUS and the –BUS in a power circuit. In accordance with the invention, a capacitor 68 is operatively coupled, for example, by soldering, between positive terminal 10a and negative terminal 10b. Capacitor 68 provides local energy capable of providing relatively large current pulses into the power circuit.

As shown in FIG. 9, capacitor 68 is advantageously mounted on appropriate conductive regions 30 such that it does not consume valuable surface area. Mounting capacitor 68 in this manner still provides excellent electrical performance because it is integrally disposed within the power circuit in close electrical proximity to the other circuit components.

Also in accordance with the invention, shunt resistors 70a and 70b can be disposed within power shell 4. Advantageously, shunt resistors 70a and 70b are placed within the power circuit in electrical proximity to high power devices 18 such that valuable surface area of the base plate is preserved. Shunt resistors 70a and 70b are preferably 1 m$\Omega$.

Figure 10:
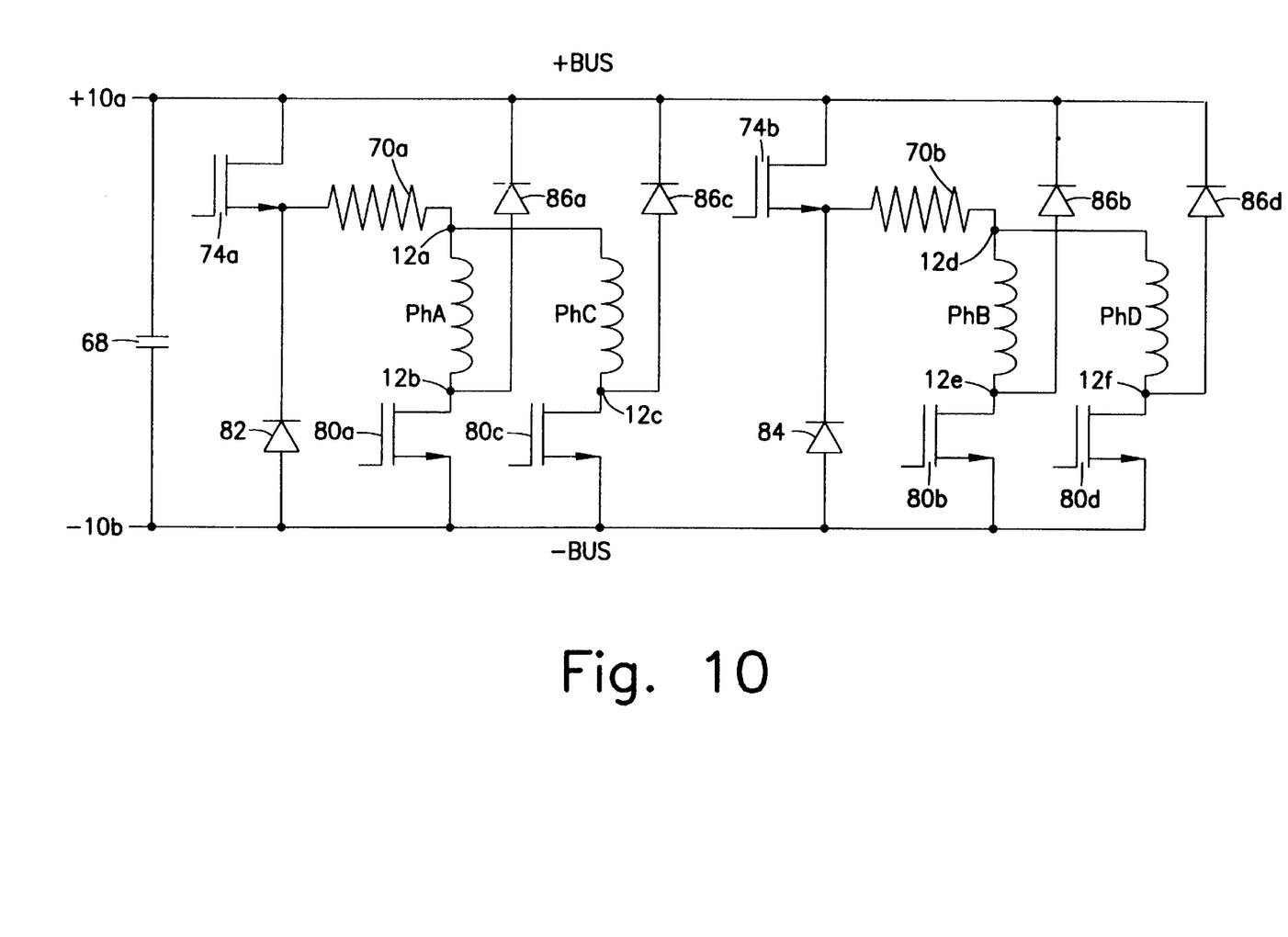
FIG. 10 is a circuit diagram showing a high power circuit for a 4-phase switched reluctance motor convertor using the components shown in FIG. 9.

FIG. 10 shows a schematic diagram of the example 4-phased switched reluctance motor convertor shown in FIG. 9. As shown in FIGS. 9 and 10, motor phase terminal 12a represents the input to motor phase A and motor phase C. Motor phase terminals 12b and c represent the respective outputs of motor phase A and motor phase C. Similarly, motor phase terminal 12d represents the input to motor phase B and motor phase D, while motor phase terminals 12e and f represent the respective outputs of motor phase B and motor phase D.

Capacitor 68 and shunt resistors 70a and 70b are also shown at their respective placement points within the circuit.

As shown in FIG. 9, thermistor 72 is mounted to base plate 6 in order to monitor the temperature of power module 2. Thermistor 72 is not an integral component of the motor convertor circuit, and is therefore not shown in FIG. 10.

As shown in FIGS. 9 and 10, input MOSFETs 74a and b are mounted to a conductive region 30 and connected to another conductive region 30 through a plurality of wire bonds 76. Wire bonds 76 used to couple one terminal of a semiconductor device to a conductive region 30 or a gate pad 78 on base plate 6 may be fabricated using any known wire bonding technique. Input MOSFETs 74a and 74b are preferably 30 volt, N-channel, die size 4.6 MOSFETs. As used herein, the die size of MOSFETs 74a and 74b along with all other semiconductor devices refer to industry standard die sizings.

Output MOSFETs 80a, 80b, 80c and 80d are coupled between their respective motor phase terminals 12b, 12c, 12e and 12f, and –BUS terminal 10b. The gates of output MOSFETs 80a–d are wire bonded to a gate pad 78 for connection to the control circuit board 8. Connection between gate pads 78 and circuit board 8 are accomplished, as discussed above, via S-pin connectors 20. Output MOSFETs 80a–d are preferably 30 volt, N-channel, die size 4 power MOSFET devices.

A/C phase diode 82, comprised of two parallel discrete semiconductor dice 82a and 82b, is positioned on conductive region 30, and located within the motor controller circuit connecting the drain of input MOSFET 74b at its cathode, and the -BUS input terminal 10b at its anode. Similarly, B/D phase diode 84 is comprised of discrete diode dice 84a and 84b and is positioned within the motor controller circuit between the drain of input MOSFET 74b at its cathode and –BUS terminal 10b at its anode. Each of diode dice 82a, 82b, 84a and 84b are preferably 45 volt Schottky, size 2 die devices.

Finally, diodes 86a–d are affixed to a conductive region 30 and positioned within the motor controller circuit such that each respective diode 86*a*, 86*b*, 86*c* and 86*d* is coupled, at its cathode to +BUS terminal 10*a*, and at its anode to a respective motor phase terminal 12*b*, 12*c*, 12*e* and 12*f*. Diodes 86*a*, 86*b*, 86*c* and 86*d* are preferably 45 volt, Schottky, size 2 die devices.

An operation of the switched reluctance motor convertor will now be described with respect to FIG. 10. Also, it should be noted that the operation of each individual phase in the 4-phase motor configuration operates in a similar manner. Therefore, only the operation of phase A is described herein.

Operation of the switched reluctance motor convertor comprises three discrete operations, namely a magnetization operation, free-wheeling operation and a forced demagnetization operation. Magnetization, free-wheeling operating and forced demagnetization are accomplished by appropriately switching power MOSFET devices on and off. During the magnetization of a phase to cause a particular motor function, input. MOSFET 74*a* and output MOSFET 80*a* are switched on by applying an appropriate gate to source voltage. Switching MOSFETs 74*a* and 80*a* on creates a current path from +BUS terminal 10*a* through shunt resistor 70*a*, the phase A motor winding and through –BUS terminal 10*b*.

During the well known free-wheeling circuit operation, output MOSFET 80*a* remains switched on, while input MOSFET 74*a* is switched off. This causes current to free-wheel during the breakdown of the phase A motor winding field through shunt resistor 70*a*, A phase input diode 82 and through output MOSFET 80*a*.

The final operation is the forced demagnetization operation in which any remaining magnetic energy is transferred to capacitor 68. During the forced demagnetization operation, input MOSFET 74*a* and output MOSFET 80*a* are switched off. This causes current to flow from –BUS terminal 10*b* through input diode 82, through shunt resistor 70*a*, and through phase A of the switched reluctance motor, completing its current path through output diode 86*a*.

Combining the magnetization, free-wheeling and forced demagnetization operations in each of 4 motor phases allows power module 2 to efficiently control the operation of a complex motor, for example, an electric power steering mechanism in an automotive application. The compact size and thermal dissipation characteristics of power module 2 allow it to be mounted on or near the power steering mechanism without risk of damage to the sensitive control electronics on circuit board 8

Thus, the power module of the present invention provides a compact, yet powerful, device which integrates high power electronic components and the low power control circuitry necessary to control module operation. The power module of the present invention is arranged to efficiently transfer thermal energy from high power devices 18 through base plate 6 for dissipation away from circuit board 8 using an externally applied heatsink, or other known heat dissipation method.

The arrangement of power shell 4, base plate 6, and circuit board 8, along with S-pin connectors 20, allows power module 2 to be easily assembled, maximizing the use of surface area while minimizing the overall size of the module. This is further accomplished through the use of a base plate 6 which uses a highly thermally conductive material such as aluminum as a substrate which has a multilayer conductive patterns etched and positioned thereon. This arrangement allows power and ground buses and connections to be arranged separately from the individual signal pads and control electronics pads, further maximizing resource utilization.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An electronic module, comprising:
   a base;
   a power shell coupled to the base, the power shell having:
      a plurality of walls forming an internal chamber;
      at least one conductive region;
   at least one electronic device mounted to the at least one conductive region; and
   a circuit board positioned within the internal chamber of the power shell.

2. The electronic module of claim 1, wherein the circuit board is electrically coupled to the base by at least one resilient connector.

3. The electronic module of claim 2, wherein the at least one resilient connector is S-shaped.

4. The electronic module of claim 1, wherein the circuit board is electrically coupled to the conductive region by at least one resilient connector.

5. The electronic module of claim 4, wherein the at least one resilient connector is S-shaped.

6. The electronic module of claim 1, wherein the at least one electronic device is a MOSFET.

7. The electronic module of claim 1, wherein the at least one electronic device comprises a power device in a switched reluctance motor convertor.

8. The electronic module of claim 1, wherein the at least one electronic device comprises a three phase DC brushless motor converter.

9. The electronic module of claim 1, wherein the base is comprised of an insulated metal substrate.

10. The electronic module of claim 9, wherein the insulated metal substrate is comprised of aluminum.

11. The electronic module of claim 1, wherein the base is comprised of a plurality of electrically isolated conductive regions.

12. The electronic module of claim 11, wherein the electrically isolated conductive regions are comprised of one of nickel plated copper or gold surface flashed nickel plated copper.

13. The electronic module of claim 1, wherein the base is comprised of a material selected from the group consisting of Al, AlSiC and Cu.

14. The electronic module of claim 9, wherein the base is fabricated using one of an $Al_2O_3$ flame spray, a direct bonded copper substrate and an active metal braze substrate.

15. The electronic module of claim 1, wherein the circuit board comprises a circuit which controls the operation of the at least one electronic device mounted to the at least one conductive region.

\* \* \* \* \*